United States Patent
Liu et al.

(10) Patent No.: US 6,813,759 B2
(45) Date of Patent: Nov. 2, 2004

(54) HYBRID OPTICAL PROXIMITY CORRECTION FOR ALTERNATING APERTURE PHASE SHIFTING DESIGNS

(75) Inventors: Hua-yu Liu, Palo Alto, CA (US); Weinong Lai, Fremont, CA (US); Xiaoyang Li, Fremont, CA (US)

(73) Assignee: Numerical Technologies, Inc., Mountain View, CA (US)

( * ) Notice: Subject to any disclaimer, the term of this patent is extended or adjusted under 35 U.S.C. 154(b) by 198 days.

(21) Appl. No.: 10/237,883

(22) Filed: Sep. 9, 2002

(65) Prior Publication Data

US 2004/0049761 A1 Mar. 11, 2004

(51) Int. Cl.[7] .......................... G06F 17/50; G06F 19/00
(52) U.S. Cl. ................................. 716/21; 430/5; 378/5; 382/144; 700/120; 700/121
(58) Field of Search .............................. 716/21; 430/5; 378/35; 700/120, 121; 382/144

(56) References Cited

U.S. PATENT DOCUMENTS

| | | | |
|---|---|---|---|
| 5,862,058 A | 1/1999 | Samuels et al. | 716/21 |
| 5,879,844 A | 3/1999 | Yamamoto et al. | 430/30 |
| 5,994,002 A | 11/1999 | Matsuoka | 430/5 |
| 6,077,310 A | 6/2000 | Yamamoto et al. | 716/19 |
| 6,114,071 A | 9/2000 | Chen et al. | 430/5 |
| 6,168,891 B1 | 1/2001 | Shibata | 430/30 |
| 6,335,130 B1 * | 1/2002 | Chen et al. | 430/5 |
| 6,541,167 B2 * | 4/2003 | Petersen et al. | 430/5 |
| 6,544,694 B2 * | 4/2003 | Dirksen et al. | 430/5 |
| 6,653,026 B2 * | 11/2003 | Pierrat et al. | 430/5 |
| 2001/0021477 A1 * | 9/2001 | Dirksen et al. | 430/5 |
| 2002/0001758 A1 * | 1/2002 | Petersen et al. | 430/5 |
| 2002/0039692 A1 * | 4/2002 | Tanaka | 430/5 |
| 2002/0076622 A1 * | 6/2002 | Pierrat et al. | 430/5 |
| 2002/0177050 A1 * | 11/2002 | Tanaka | 430/5 |
| 2004/0048170 A1 * | 3/2004 | Pierrat et al. | 430/5 |

OTHER PUBLICATIONS

Choi, Y., et al., "Optical Proximity Correction on Attenuated Phase Shifting Photo Mask for Dense Contact Array", LG Semicon Company (11 pages), no date.
Toublan, O., et al., "Phase and Transmission Errors Aware OPC Solution for PSM: Feasibility Demonstration", Mentor Graphics Corp. (7 pages), no date.
Rieger, M., et al., "System for Lithography Proximity Compensation", Precim Company, Portland, Oregon, Sep. 1993 (28 pages).
Ohnuma, H., et al., "Lithography Computer Aided Design Technology for Embedded Memory in Logic", Jpn. J. Appl. Phys. vol. 37, Part I, No. 12B, pp. 6686–6688, Dec. 1998.
Spence, C., et al., "Integration of Optical Proximity Correction Strategies in Strong phase Shifters Design for Poly–Gate Layers", Bacus News, vol. 15, Issue 12, pp. 1, 4–13, Dec. 1999.
Cooke, M., "OPC/PSM Designs For Poly Gate Layers", European Semiconductor, vol. 22, No. 7, pp. 57–59, Jul. 2000.
Schellenberg, F., et al., "OPC Beyond 0.18$\mu$m: OPC on PSM Gates", SPIE, vol. 4000, pp. 1062–1069, Mar. 1–3, 2000.
Toublan, O., et al., "Phase Aware Proximity Correction for Advanced Masks", SPIE, vol. 4000, pp. 160–170, Mar. 1–3, 2000.

* cited by examiner

Primary Examiner—Matthew Smith
Assistant Examiner—Phallaka Kik
(74) Attorney, Agent, or Firm—Park, Vaughan & Fleming, LLP

(57) ABSTRACT

One embodiment of the invention provides a system that facilitates optical proximity correction for alternating aperture phase shifting designs. During operation, the system receives a layout, which includes a complementary mask and a phase shifting mask. A subset of trim features on the complementary mask that are designed to protect the dark areas left unexposed by the phase shifting mask are adjusted first using a rules-based optical proximity correction process. This is then supplemented by a model-based correction to the phase shifters, Additionally, the portions of the trim that are co-extensive with the original layout can be corrected, e.g. at the time of the correction of the complementary mask using either rule or model based corrections.

25 Claims, 5 Drawing Sheets

HYBRID OPTICAL PROXIMITY CORRECTION FOR ALTERNATING APERTURE PHASE SHIFTING DESIGNS

BACKGROUND

1. Field of the Invention

The invention relates to the process of designing an integrated circuit. More specifically, the invention relates to a method and an apparatus that facilitates a hybrid optical proximity correction technique for alternating phase shift masks.

2. Related Art

Recent advances in integrated circuit technology have largely been accomplished by decreasing the feature size of circuit elements on a semiconductor chip. As the feature size of these circuit elements continues to decrease, circuit designers are forced to deal with problems that arise as a consequence of the optical lithography process that is used to manufacture integrated circuits. This optical lithography process generally begins with the formation of a photoresist layer on the surface of a semiconductor wafer. A mask composed of opaque regions, which are generally formed of chrome, and light-transmissive clear regions, which are generally formed of quartz, is then positioned over this photoresist layer coated wafer. (Note that the term "mask" as used in this specification is meant to include the term "reticle.") Light is then shone on the mask from a visible light source or an ultraviolet light source. More generally an appropriate type of electromagnetic radiation is used in combination with suitable masks and photoresists.

This light is generally reduced and focused through an optical system that contains a number of lenses, filters, and mirrors. The light passes through the clear regions of the mask and exposes the underlying photoresist layer. At the same time, the light is blocked by opaque regions of the mask, leaving underlying portions of the photoresist layer unexposed.

The exposed photoresist layer is then developed, typically through chemical removal of the exposed/non-exposed regions of the photoresist layer. The end result is a semiconductor wafer with a photoresist layer having a desired pattern. This pattern can then be used for etching underlying regions of the wafer.

One solution to producing ever-smaller feature sizes is to use phase shifting. In phase shifting, phase shifters are often incorporated into a mask in order to achieve line widths that are smaller than the wavelength of the light that is used to expose the photoresist layer through the mask. During phase shifting, destructive interference caused by two adjacent clear areas on a mask is used to create an unexposed area on the photoresist layer. This is accomplished by exploiting the fact that light passing through a mask's clear regions exhibits a wave characteristic having a phase that is a function of the distance the light travels through the mask material. By placing two clear areas adjacent to each other on the mask, one of thickness $t_1$ and the other of thickness $t_2$, one can obtain a desired unexposed area on the underlying photoresist layer caused by interference. By varying the thickness $t_1$ and $t_2$ appropriately, the light exiting the material of thickness $t_2$ is 180 degrees out of phase with the light exiting the material of thickness $t_1$. Phase shifting is described in more detail in U.S. Pat. No. 5,858,580, entitled "Phase Shifting Circuit Manufacture Method and Apparatus," by inventors Yao-Ting Wang and Yagyensh C. Pati, filed Sep. 17, 1997 and issued Jan. 12, 1999, which is hereby incorporated by reference.

There can be problems with existing phase shifting techniques and the ability to use standard optical proximity correction (OPC) techniques to bring the predicted feature width to the desired feature width. As shown in FIG. 1, the nominal line width (critical dimension) varies with σ (or partial coherency) over different pitches. More specifically, a small σ provides higher resolution and better process windows but exhibits worse proximity effects. Thus, for example if the target critical dimension (CD) is 70 nm, then, the range of variation in CD through pitch is too large to be corrected with current OPC techniques.

Another problem arises during the process of generating phase shifters and associated trim for the complementary mask. A phase shifter located on a phase shifting mask is generated along with associated trim located on a complementary mask. During exposure of the complementary mask, this trim protects the region left unexposed by the phase shifter during exposure of the phase shifting mask. Attempts have been made to apply trim correction on small trim widths. However, applying trim correction to small trim widths leads to a number of problems: it can reduce image contrast; it can reduce the size of the process window; and it can reduce the overlay budget. Hence, applying trim correction to small trim widths is generally unacceptable as a manufacturing solution. Optical proximity correction for trim masks is performed only on edges that were in the original layout.

What is needed is a method and an apparatus for adjusting trim without the problems stated above.

SUMMARY

One embodiment of the invention provides a system that facilitates optical proximity correction for alternating phase shift masks. During operation, the system receives a layout, which includes a complementary mask and a phase shift mask. Next, the system performs a first optical proximity correction process on the complementary mask. This first optical proximity correction process adjusts a subset of features within a given pitch range on the complementary mask. The system then performs a second optical proximity correction process on the phase shift mask for PSM defined features. This second optical proximity correction process adjusts a phase shifter width on the phase shift mask.

In one embodiment of the invention, the first optical proximity correction process involves a, simple, rule-based optical proximity correction process.

In one embodiment of the invention, the second optical proximity correction process involves a model-based optical proximity correction process. In an alternative embodiment, a rule based optical proximity correction process can be used.

In one embodiment of the invention, adjusting a feature on the complementary mask involves moving a distal trim edge relative to an associated gate structure.

In one embodiment of the invention, adjusting the phase shifter width involves moving either a shifter edge or a chrome regulator edge of a phase shifter.

Although the term "optical proximity correction" is used, more generally the correction can be for all types of proximity effects such as microloading effects, etc., to the extent the rules and models have been designed with such proximity effects in mind.

DETAILED DESCRIPTION

Computer System

Figure 1:
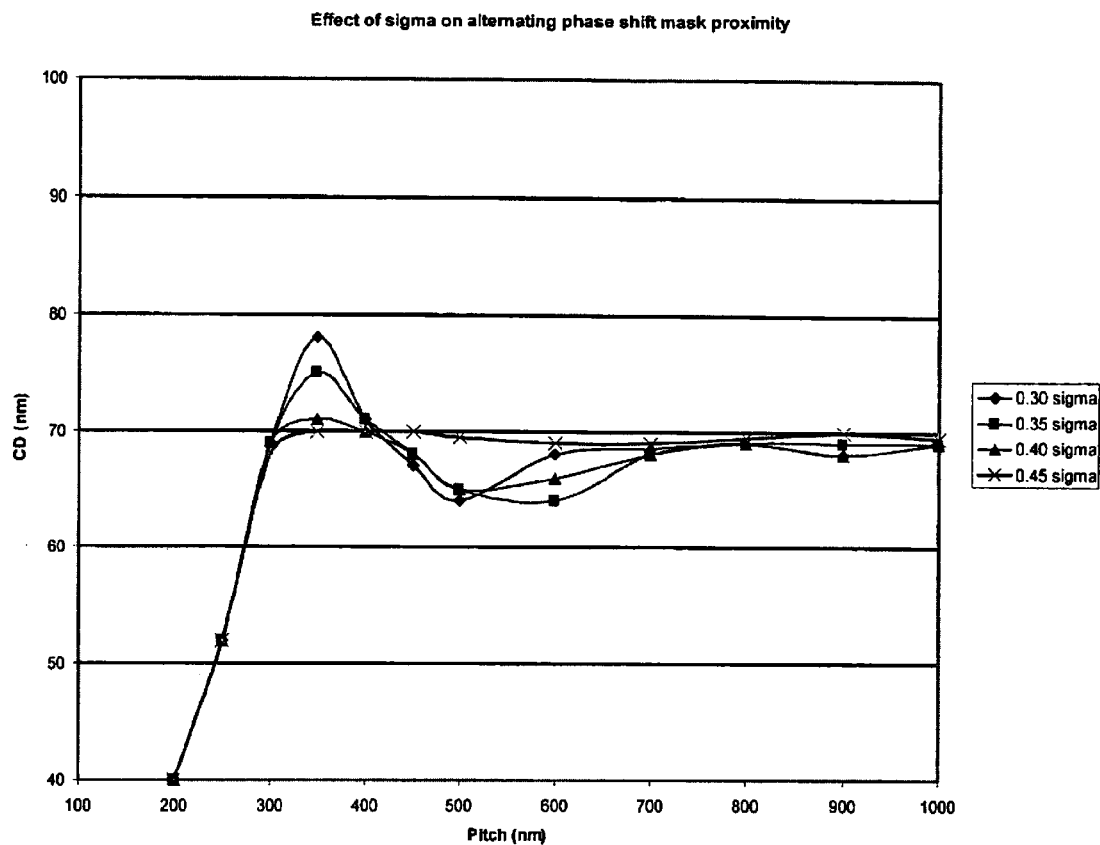
FIG. 1 presents a graph illustrating the effects of σ (or partial coherency) on patterned line width through pitch for an alternating phase shift mask.
Figure 2:
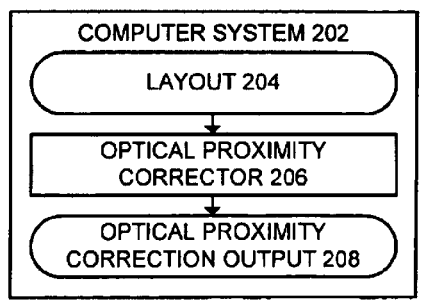
FIG. 2 illustrates a computer 202 in accordance with an embodiment of the invention.

FIG. 2 illustrates a computer system 202 in accordance with an embodiment of the invention. Computer system 202 contains layout 204, optical proximity corrector 206, and optical proximity correction output 208. Computer system 202 can generally include any type of computer system, including, but not limited to, a computer system based on a microprocessor, a mainframe computer, a distributed processing cluster of computers coupled in communication, etc. Additionally, the layout 204 and the output 208 may be stored remotely from the computer system 202. For example, they may be stored on a network that is coupled in communication with the computer system 202.

Layout 204 contains data that specifies the layout for an integrated circuit device. This layout can be in any acceptable format, such as GDSII stream format. In operation, optical proximity corrector 206 first applies corrections for optical proximity effects. In doing so, optical proximity corrector 206 applies rule-based optical proximity correction on complementary masks in a first correction and then applies (rule or) model-based optical proximity correction on phase shift masks in a second correction. Optical proximity correction output 208 is subsequently provided to a subsequent process for fabricating the integrated circuit device, or is stored for later use. For example, the output 208 could be provided to a checking tool such as the SiVL® software from Numerical Technologies, Inc., San Jose, Calif., or to a mask data preparation tool such as the CATS™ software, also from Numerical Technologies, Inc.

Rule-base optical proximity correction refers to an optical proximity correction process that is driven by rules to select the features that will be corrected and to describe the amount of correction to the same. For example, the rule can include applying optical proximity correction to complementary masks for features with dimensions that are spaced at certain pitches. More specifically for pitches from x nm to x+10 nm a correction of y nm to the edges of the shifter could be applied, and so on. The effectiveness of the trim correction will be discussed in greater detail, below, in connection with FIG. 3.

Model-based optical proximity correction refers to an optical proximity correction process that has been calibrated to a particular process model and can provide superior results when compared against rule-based optical proximity correction, but can require significantly more computational effort. More specifically, during model-based OPC, the layout can be segmented and an iterative adjustment process performed on each segment based on modeling where the segments will print, adjusting, and rechecking.

Optical Proximity Correction Results

Figure 3A:
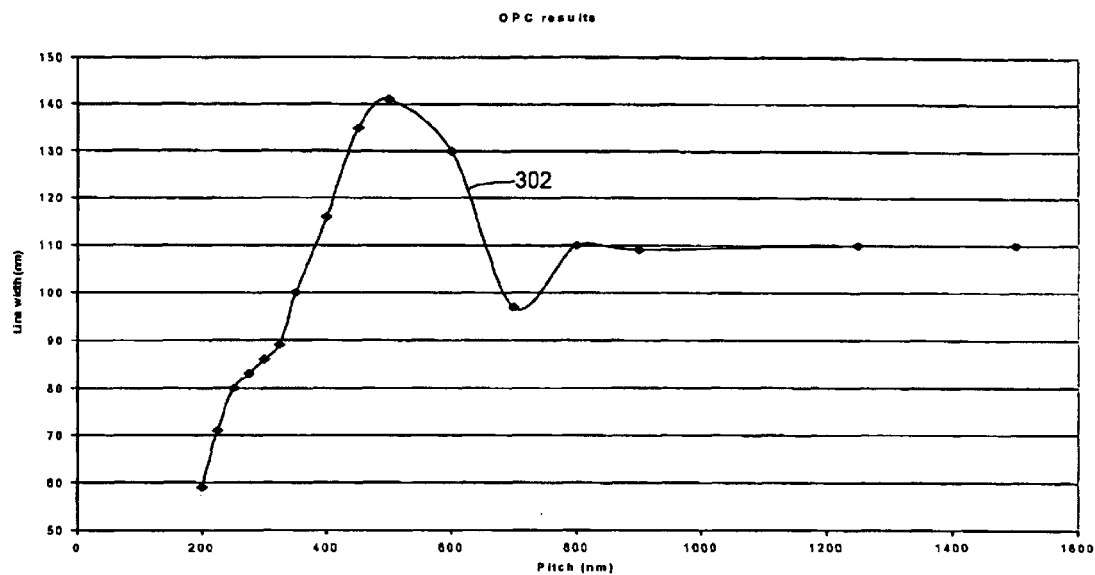
FIG. 3A is a graph illustrating the nominal line width in nanometers (nm) as a function of pitch in nanometers prior to any optical proximity correction in accordance with an embodiment of the invention.

FIGS. 3A–D illustrate the results of optical proximity correction in accordance with an embodiment of the invention and contrasting the same with other approaches. FIG. 3A is a graph illustrating the nominal line width in nanometers (nm) as a function of pitch in nanometers prior to any optical proximity correction in accordance with an embodiment of the invention. Data series 302 illustrates the nominal line width in nanometers (nm) as a function of pitch in nanometers prior to any optical proximity correction for a fixed partial coherency ($\delta$) as determined by the process model. Note that the target line width is 100 nm. As can be seen, the nominal width varies significantly from the target line width as the pitch is varied.

Figure 3B:
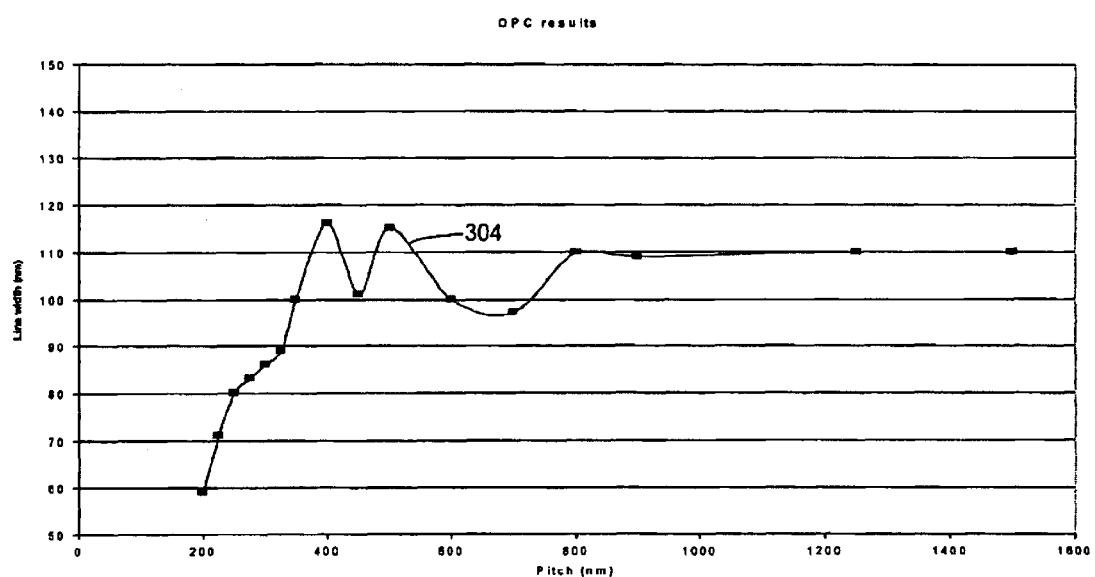
FIG. 3B is a graph illustrating the line width with optical proximity correction applied to the complementary mask in accordance with an embodiment of the invention.

FIG. 3B is a graph illustrating the line width with optical proximity correction applied to the complementary mask in accordance with an embodiment of the invention. Data series 304 illustrates the line width with the rules-based optical proximity correction applied only to the complementary mask, as discussed above. As can be seen, this correction is insufficient by itself to correct the line widths, but it provides a foundation for the later applied corrections to the phase shifting layout.

Figure 3C:
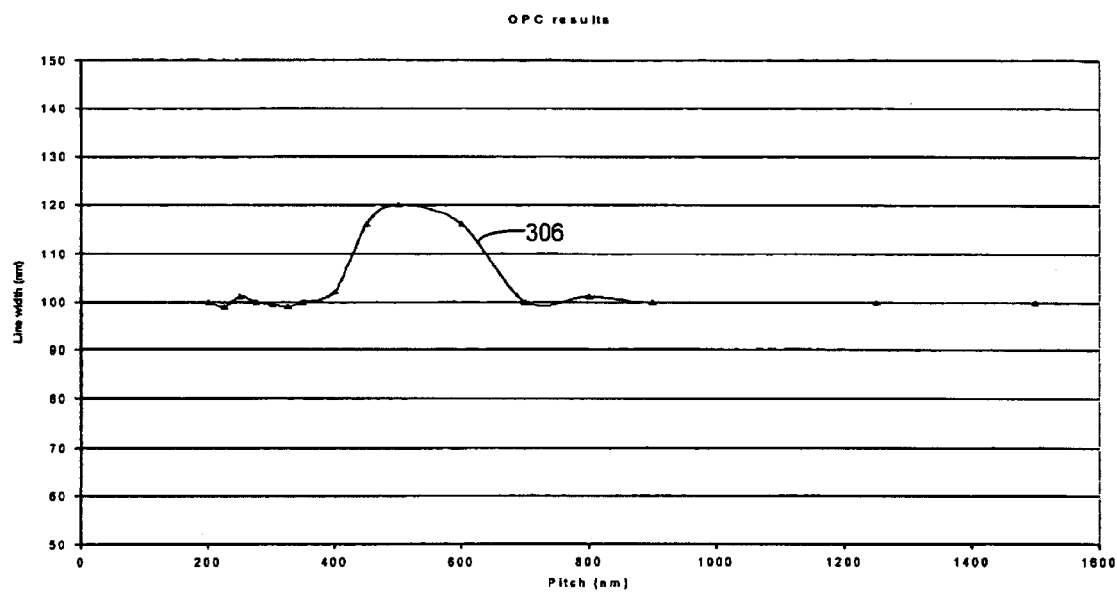
FIG. 3C is a graph illustrating the line width with optical proximity correction applied to the phase shifting mask in accordance with an embodiment of the invention.

FIG. 3C is a graph illustrating the line width with optical proximity correction applied to the phase shifting mask in accordance with an embodiment of the invention. Data series 306 illustrates the nominal width when standard, prior art, model-based optical proximity correction is applied to the phase shifting layer without first applying the rule-based correction to the complementary mask. As shown, there are significant errors in the output at certain pitches.

Figure 3D:
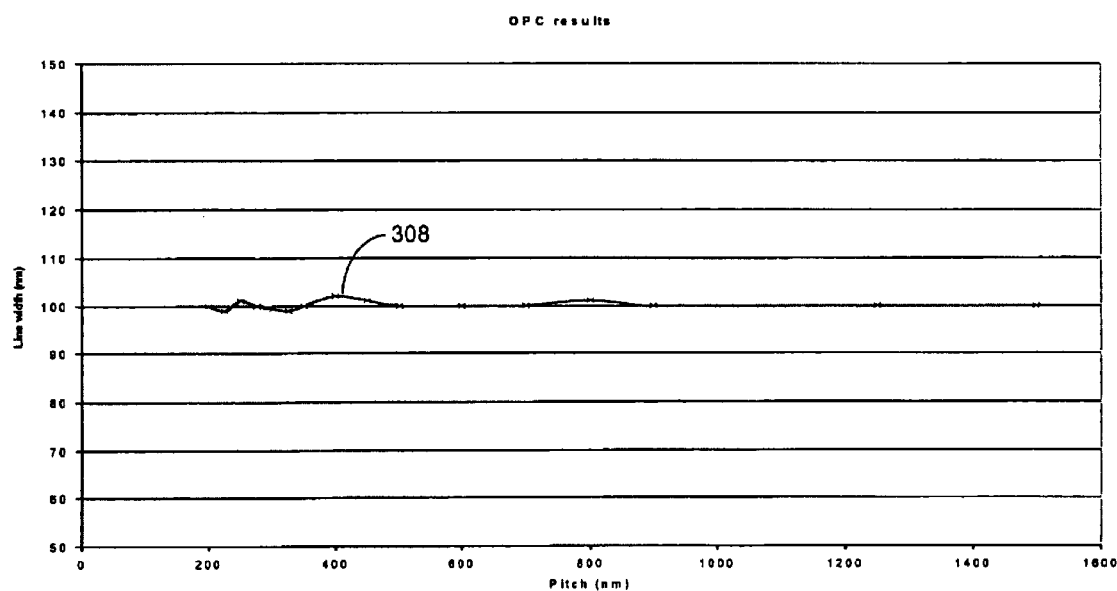
FIG. 3D is a graph illustrating the line width with optical proximity correction applied to both the complementary mask and the phase shifting mask in accordance with an embodiment of the invention.

FIG. 3D is a graph illustrating the line width with optical proximity correction applied to both the complementary mask and the phase shifting mask in accordance with an embodiment of the invention. The results using an embodiment of the present invention, e.g. applying both the rule-based correction to the complementary mask and the model-based correction to the shifter mask, is illustrated by data series 308. Note that data series 308 shows that the nominal line width stays much closer to the target line width of 100 nm.

Shifter and Complementary Masks

Figure 4:
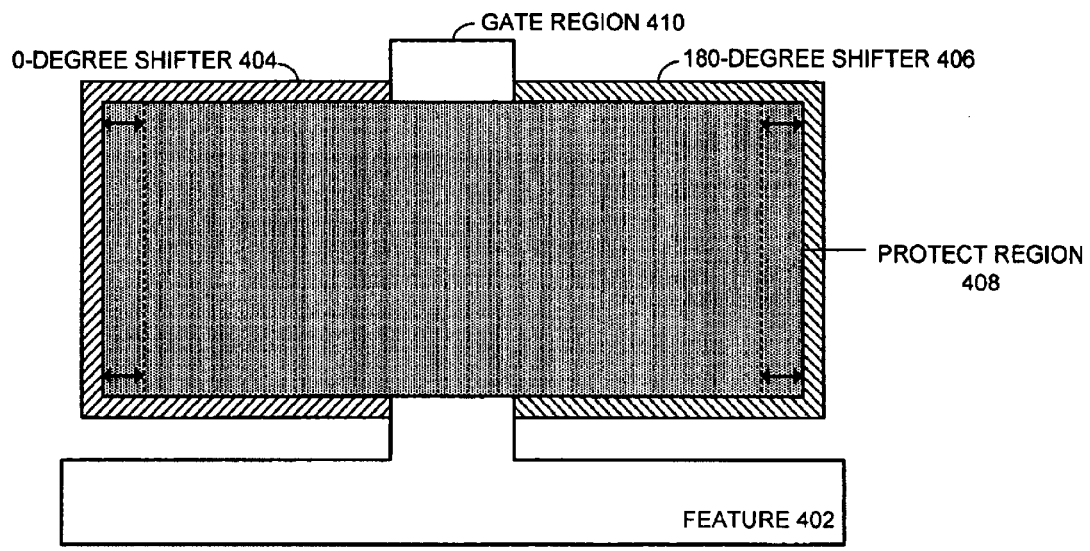
FIG. 4 illustrates mask features in proximity to a transistor gate in accordance with an embodiment of the invention.

FIG. 4 illustrates mask features in proximity to a transistor gate in accordance with an embodiment of the invention. Feature 402 includes gate region 410, which is formed using 0-degree phase shifter 404, 180-degree phase shifter 406, and protect region 408. The complementary mask includes protect region 408 and all of feature 402 as well. A rule-base optical proximity correction process is performed on the complementary mask prior to a model-based optical proximity correction process being performed on the phase shift mask. This rule-based optical proximity correction process adjusts the distal edges—the edges farthest from gate region 410—of protect region 408 on the complementary mask inward toward gate region 410 as shown based on the target width for the gate region 410 and the pitch.

Alternating Phase Shift Masks

Figure 5:
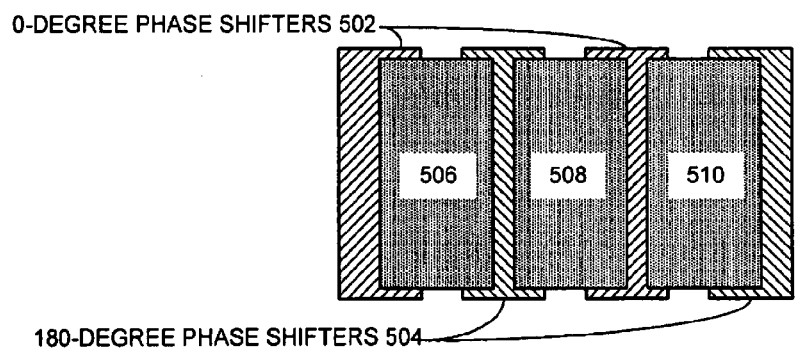
FIG. 5 illustrates complementary masks applied over alternating phase shift masks in accordance with an embodiment of the invention.

FIG. 5 illustrates portions of trim masks applied over alternating aperture phase shifters to define three lines in accordance with an embodiment of the invention. Protect regions 506, 508, and 510 are applied over 0-degree phase shifters 502 and 180-degree phase shifters 504. The distal edges of trim features 506, 508, and 510 can be adjusted by the rule-based optical proximity correction process as described above. Please note that for simplicity, the figure does not show the entire complementary mask, but only the portion of the trim protecting the lines defined by the phase shifters.

Optical Proximity Correction

Figure 6:
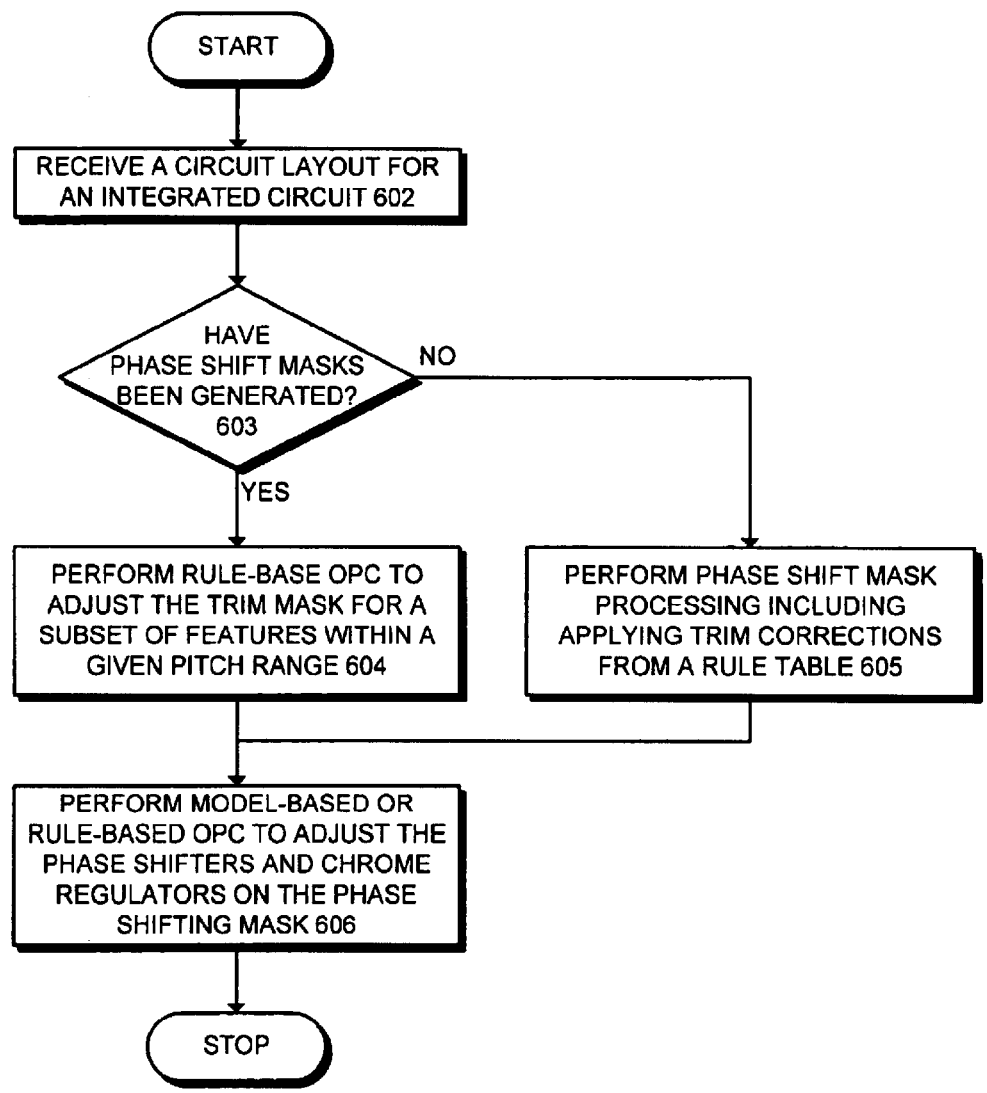
FIG. 6 is a flowchart illustrating the process of performing optical proximity correction in accordance with an embodiment of the invention.

FIG. 6 is a flowchart illustrating the process of performing optical proximity correction in accordance with an embodiment of the invention. This flowchart illustrates the steps to perform the data translations identified in conjunction with FIG. 2 above. The system starts at step 602 with the receipt of a layout for an integrated circuit, e.g. the layout 204. This layout can be in any acceptable format such as GDSII stream format. Next, the system determines if phase shift masks have been generated for the layout (step 603). If so, the system proceeds to step 604. Depending on the capabilities of the input format, there may be multiple layouts, or files, to represent the two masks for the alternating aperture phase shifting design. In one embodiment, different layers of the input format are used to represent features on different masks, e.g. one layer for 0-degree phase shifters, one layer for 180-degree phase shifters, and one or more layers for storing features for the complementary mask. Additionally, the original, layout may be in a layer as well. Next, optical proximity corrector 208 performs a rule-based optical proximity correction on the complementary mask to adjust a subset of features within a specified pitch range (step 604).

If phase shift masks have not been generated at step 603, the system performs phase shift mask processing (step 605). This phase shift mask processing includes applying trim corrections from a rule table. Note that this rule table is can be the same rule table used in step 604.

After performing OPC at step 604 or PSM processing at step 605, optical proximity corrector 208 performs a proximity correction on the phase shifters and chrome regulators to adjust the final feature width (step 606). This can be done using either rule, model, or hybrid OPC. In one embodiment, the OPC at this step occurs on edges of the phase shifters that are adjacent the original design. The modifications to the control chrome are a net result of this model-based OPC.

The preceding description is presented to one to make and use the invention, and is provided in the context of a particular application and its requirements. Various modifications to the disclosed embodiments will be readily apparent, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein.

The data structures and code described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet and the carrier wave may include programs for performing the processes access across the network. More specifically, the computer data signal may include programs for performing optical proximity correction access across a network.

The foregoing descriptions of embodiments of the invention have been presented for purposes of illustration and description only. They are not intended to be exhaustive or to limit the invention to the forms disclosed. The scope of the invention is defined by the appended claims.

What is claimed is:

1. A method to facilitate optical proximity correction for alternating aperture phase shifting designs for a layout, comprising:

receiving the layout, wherein the layout includes a description of one or more features to be placed into different masks;

performing a first optical proximity correction process on a trim mask having a plurality of structures for protecting features defined by a phase shifting mask;

wherein the first optical proximity correction process adjusts a subset of the plurality of structures within a given pitch range on the trim mask; and performing a second optical proximity correction process on the phase shift mask having a plurality of phase shifters, each having a phase shifter width;

wherein the second optical proximity correction process adjusts phase shifter width of phase shifters in the plurality of phase shifters on the phase shift mask.

2. The method of claim 1, wherein the first optical proximity correction process involves a rule-based optical proximity correction process on the plurality of structures on the trim mask and a model-based optical proximity correction process on the plurality of phase shifters and other features.

3. The method of claim 1, wherein the second optical proximity correction process involves one of a model-based and a rule-based optical proximity correction process.

4. The method of claim 1, wherein adjusting a structure on the trim mask involves moving a distal trim edge relative to an associated gate structure.

5. The method of claim 1, wherein adjusting the phase shifter width involves moving either a shifter edge or a chrome regulator edge of a phase shifter.

6. A computer-readable storage medium storing instructions that when executed by a computer cause the computer to perform a method to facilitate optical proximity correction for alternating aperture phase shifting designs for a layout, the method comprising:

receiving the layout, wherein the layout includes a description of one or more features to be placed into different masks;

performing a first optical proximity correction process on a trim mask having a plurality of structures for protecting features defined by a phase shifting mask;

wherein the first optical proximity correction process adjusts a subset of the plurality of structures within a given pitch range on the trim mask; and performing a second optical proximity correction process on the phase shift mask having a plurality of phase shifters, each having a phase shifter width;

wherein the second optical proximity correction process adjusts phase shifter width of phase shifters in the plurality of phase shifters on the phase shift mask.

7. The computer-readable storage medium of claim 6, wherein the first optical proximity correction process involves a rule-based optical proximity correction process on the plurality of structures on the trim mask and a model-based optical proximity correction process on the plurality of phase shifters and other features.

8. The computer-readable storage medium of claim 6, wherein the second optical proximity correction process involves one of a model-based and a rule-based optical proximity correction process.

9. The computer-readable storage medium of claim 6, wherein adjusting a structure on the trim mask involves moving a distal trim edge relative to an associated gate structure.

10. The computer-readable storage medium of claim 6, wherein adjusting the phase shifter width involves moving either a shifter edge or a chrome regulator-edge of a phase shifter.

11. An apparatus to facilitate optical proximity correction for alternating phase shift masks, comprising:
 a receiving mechanism that is configured to receive a layout, wherein the layout includes a description of one or more features to be placed into different masks; and
 an optical proximity correction performing mechanism that is configured to perform a first optical proximity correction process on a trim mask having a plurality of structures for protecting features defined by a phase shifting mask;
 wherein the first optical proximity correction process adjusts a subset of the plurality of structures within a given pitch range on the trim mask;
 wherein the optical proximity correction performing mechanism is further configured to perform a second optical proximity correction process on the phase shift mask having a plurality of phase shifters, each having a phase shifter width;
 wherein the second optical proximity correction process adjusts a phase shifter width of phase shifters in the plurality of phase shifters on the phase shift mask.

12. The apparatus of claim 11, wherein the first optical proximity correction process involves a rule-based optical proximity correction process on the plurality of structures on the trim mask and a model-based optical proximity correction process on the plurality of phase shifters and other features.

13. The apparatus of claim 11, wherein the second optical proximity correction process involves one of a model-based and a rule-based optical proximity correction process.

14. The apparatus of claim 11, wherein adjusting a structure on the trim mask involves moving a distal trim edge relative to an associated gate structure.

15. The apparatus of claim 11, wherein adjusting the phase shifter width involves moving either a shifter edge or a chrome regulator edge of a phase shifter.

16. A reticle for use in fabricating an integrated circuit, wherein the reticle is formed by a process, the process comprising:
 receiving a layout, wherein the layout includes a description of one or more features to be placed into different masks;
 performing a first optical proximity correction process on a trim mask having a plurality of structures for protecting features defined by a phase shifting mask;
 wherein the first optical proximity correction process adjusts a subset of the plurality of structures within a given pitch range on the trim mask; and
 performing a second optical proximity correction process on the phase shift mask having a plurality of phase shifters, each having a phase shifter width;
 wherein the second optical proximity correction process adjusts phase shifter width of phase shifters in the plurality of phase shifters on the phase shift mask.

17. The reticle of claim 16, wherein the first optical proximity correction process involves a rule-based optical proximity correction process on the plurality of structures on the trim mask and a model-based optical proximity correction process on the plurality of phase shifters and other features.

18. The reticle of claim 16, wherein the second optical proximity correction process involves one of a model-based and a rule-based optical proximity correction process.

19. The reticle of claim 16, wherein adjusting a structure on the trim mask involves moving a distal trim edge relative to an associated gate structure.

20. The reticle of claim 16, wherein adjusting the phase shifter width involves moving either a shifter edge or a chrome regulator edge of a phase shifter.

21. A means for facilitating optical proximity correction for alternating phase shift masks, comprising:
 a receiving means for receiving a layout, wherein the layout includes a description of one or more features to be placed into different masks; and
 an optical proximity correction means for performing a first optical proximity correction process on a trim mask having a plurality of structures for protecting features defined by a phase shifting mask;
 wherein the first optical proximity correction process adjusts a subset of the plurality of structures within a given pitch range on the trim mask;
 wherein the optical proximity correction means is further configured to perform a second optical proximity correction process on the phase shift mask having a plurality of phase shifters, each having a phase shifter width;
 wherein the second optical proximity correction process adjusts a phase shifter width of phase shifters in the plurality of phase shifters on the phase shift mask.

22. The means of claim 21, wherein the first optical proximity correction process involves a rule-based optical proximity correction process on the plurality of structures on the trim mask and a model-based optical proximity correction process on the plurality of phase shifters and other features.

23. The means of claim 21, wherein the second optical proximity correction process involves one of a model-based and a rule-based optical proximity correction process.

24. The means of claim 21, wherein adjusting a structure on the trim mask involves moving a distal trim edge relative to an associated gate structure.

25. The means of claim 21, wherein adjusting the phase shifter width involves moving either a shifter edge or a chrome regulator edge of a phase shifter.

* * * * *